United States Patent [19]

Chan et al.

[11] Patent Number: 5,286,336
[45] Date of Patent: Feb. 15, 1994

[54] SUBMICRON JOSEPHSON JUNCTION AND METHOD FOR ITS FABRICATION

[75] Inventors: Hugo W. Chan; Arnold H. Silver, both of Rancho Palos Verdes; Robert D. Sandell, Manhattan Beach; James M. Murduck, Lawndale, all of Calif.

[73] Assignee: TRW Inc., Redondo Beach, Calif.

[21] Appl. No.: 952,011

[22] Filed: Nov. 2, 1992

Related U.S. Application Data

[62] Division of Ser. No. 734,669, Jul. 23, 1991, abandoned.

[51] Int. Cl.$^5$ .................. B44C 1/22; C03C 15/00; C03C 25/06; C23F 1/00
[52] U.S. Cl. .................... 156/643; 156/656; 156/657; 156/667; 505/1; 505/728; 505/832; 437/910; 437/189
[58] Field of Search ............... 156/643, 650, 652, 656, 156/657, 659.1, 655, 667; 505/1, 702, 728, 832; 204/192.24; 427/62, 63; 257/37–39; 365/162; 357/5; 437/190, 228, 910, 189, 192

[56] References Cited

U.S. PATENT DOCUMENTS

| | | | |
|---|---|---|---|
| 4,904,619 | 2/1990 | Yamada et al. | 437/190 |
| 4,933,318 | 6/1990 | Heijman | 505/1 |
| 5,047,390 | 9/1991 | Higashino et al. | 505/1 |
| 5,215,960 | 6/1993 | Tanaka et al. | 505/1 |

*Primary Examiner*—William A. Powell
*Attorney, Agent, or Firm*—Sol L. Goldstein; James M. Steinberger

[57] ABSTRACT

A Josephson junction and a method for its fabrication in which a laminated junction layer is formed in situ on the side edge of a base electrode contact. The laminated junction layer forms the Josephson junction of the present invention and includes an insulating or barrier layer sandwiched between a superconducting base electrode and a superconducting counter electrode. The Josephson junction is formed on the side edge of the base electrode contact to allow very small junction areas to be fabricated using conventional optical lithographic techniques, such as photolithography. The laminated junction layer is formed in situ, with the three layers of the laminated junction layer being formed successively without removing the device from the controlled atmosphere of the deposition system, to prevent contamination of the junction region.

12 Claims, 3 Drawing Sheets

SUBMICRON JOSEPHSON JUNCTION AND METHOD FOR ITS FABRICATION

This is a divisional application Ser. No. 07/734,660, filed Jul. 23, 1991, now abandoned.

BACKGROUND OF THE INVENTION

This invention relates generally to superconducting electronic devices and, more particularly, to superconducting Josephson junctions and methods for their fabrication.

A superconducting Josephson junction is a bi-stable switching device having a very thin insulating or barrier layer sandwiched between a superconducting base electrode and a superconducting counter electrode. When current supplied to the Josephson junction is increased above the junction's critical current, the device is switched from a superconducting zero-voltage state to a resistive voltage state. The resistive voltage state is switched off by reducing the current supplied to the junction to about zero. Because this switching operation can occur in as little as a few picoseconds, the Josephson junction is a very high speed switching device which is particularly useful in superconducting electronic devices.

Josephson junctions are frequently fabricated by depositing a superconducting layer, such as niobium (Nb), on an insulating substrate. The superconducting layer is patterned and etched using conventional optical lithographic techniques to form the base electrode. The insulating or barrier layer is then formed by depositing an insulating material on the base electrode or by oxidizing the surface of the base electrode. The counter electrode is then formed on the insulating layer by depositing another superconducting layer.

Although this conventional fabrication process is widely used, it has several disadvantages. One disadvantage is that conventional optical lithographic techniques, such as photolithography, are generally limited to linewidths of about a micron. X-ray or electron beam lithographic techniques have submicron linewidths, but these techniques are extremely expensive and are not presently suitable for mass production of electronic devices. Submicron linewidths are needed for fabricating Josephson junctions with small junction areas, which are desirable because they increase the speed of the device and allow more Josephson junctions to be packed onto a substrate, thus saving space and decreasing signal propagation time between the junctions.

Another disadvantage of this conventional fabrication process is that the junction region is exposed to undesirable contaminants. For example, the insulating barrier layer is formed on a base electrode which has been exposed to the atmosphere, covered with photoresist materials and subjected to the chemicals used in the etching process. Accordingly, there has been a need for a Josephson junction and a method for its fabrication which does not suffer from these disadvantages. The present invention clearly fulfills this need.

SUMMARY OF THE INVENTION

The present invention resides in a submicron Josephson junction and a method for its fabrication in which a laminated junction layer is formed in situ on the side edge of a base electrode contact. The laminated junction layer forms the Josephson junction of the present invention and includes an insulating or barrier layer sandwiched between a superconducting base electrode and a superconducting counter electrode.

The Josephson junction is formed on the side edge of the base electrode contact to allow very small junction areas to be fabricated using conventional optical lithographic techniques, such as photolithography. One of the dimensions of the junction area is defined by the thickness of the base electrode contact and the other dimension of the junction area is defined by the linewidth of the type of lithography that is used for fabricating the device. The thickness of the base electrode contact can be accurately controlled and made very small by adjusting the length of time that material is deposited to form the layer. To prevent contamination of the junction region, the laminated junction layer is formed in situ, with the three layers of the laminated junction layer being formed successively without removing the device from the controlled atmosphere of the deposition system.

It will be appreciated from the foregoing that the present invention represents a significant advance in the field of superconducting Josephson junctions. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
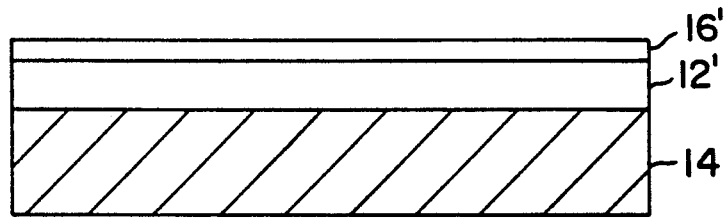
FIG. 1 is a sectional view of the step of forming a superconducting layer and a first dielectric layer on an insulating substrate.

As shown in the drawings for purposes of illustration, the present invention is embodied in a submicron Josephson junction and a method for its fabrication in which a laminated junction layer is formed in situ on the side edge of a base electrode contact. In a conventional fabrication method for Josephson junctions, a superconducting layer is deposited on an insulating substrate and the layer is then patterned and etched using conventional optical lithographic techniques to form a base electrode. Unfortunately, conventional optical lithographic techniques, such as photolithography, are generally limited to linewidths of about a micron, thus preventing the fabrication of small junction areas. In addition, the junction region is exposed to undesirable contaminants, such as the photoresist materials used in the patterning process and the chemicals used in the etching process.

In accordance with the present invention, a Josephson junction is formed on the side edge of the base electrode contact to allow very small junction areas to be fabricated using conventional optical lithographic techniques. To prevent contamination of the junction region, the laminated junction layer is formed in situ, with its three layers being formed successively without removing the device from the controlled atmosphere of the deposition system.

Figure 8:
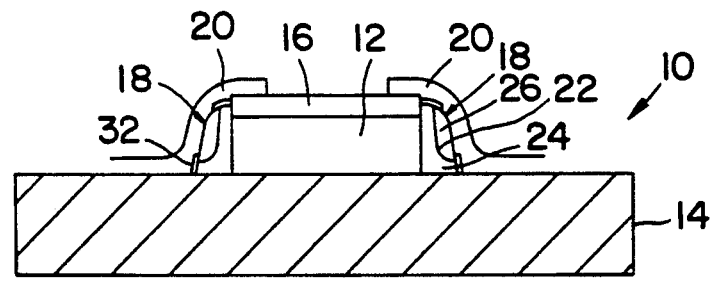
FIG. 8 is a sectional view of the step of forming a counter electrode contact and of the completed submicron Josephson junction of the present invention.
Figure 9:
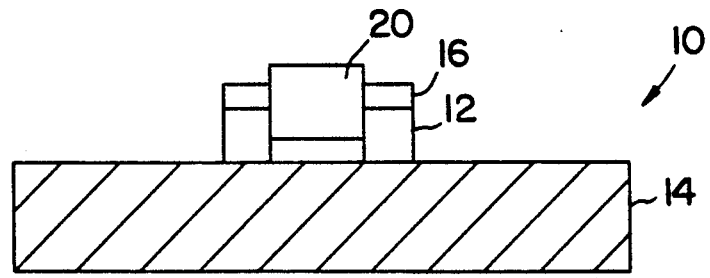
FIG. 9 is a side elevational view of the submicron Josephson junction of the present invention.

As illustrated in FIGS. 8 and 9, a submicron Josephson junction 10 in accordance with the present invention is fabricated on the side edge of a base electrode contact 12. The submicron Josephson junction 10 includes the base electrode contact 12, which is formed on the upper surface of an insulating substrate 14, a first dielectric layer 16 formed on the upper surface of the base electrode contact 12, a laminated junction layer 18 formed on the side edge of the base electrode contact 12, and a counter electrode contact 20 formed on the upper surface of the laminated junction layer 18. The laminated junction layer 18 forms the Josephson junction of the present invention and includes an insulating or barrier layer 22 sandwiched between a superconducting base electrode 24 and a superconducting counter electrode 26.

One of the dimensions of the junction area is defined by the thickness of the base electrode contact 12 and first dielectric layer 16 and the other dimension of the junction area is defined by the linewidth of the type of lithography that is used for fabricating the device. The thickness of the base electrode contact 12 and the first dielectric layer 16 can be accurately controlled and made very small by adjusting the length of time that material is deposited to form these two layers. To prevent contamination of the junction region, the three layers 22, 24, 26 of the laminated junction layer 18 are formed in situ, with the three layers being formed successively without removing the substrate 14 from the controlled atmosphere of the deposition system.

The method for fabricating the submicron Josephson junction 10 of the present invention is illustrated in FIGS. 1-9. As shown in FIG. 1, a layer of superconducting material 12', such as niobium (Nb), is deposited on the upper surface of the insulating substrate 14. The superconducting layer 12' may be deposited on the insulating substrate 14, for example, by sputtering or evaporation. The insulating substrate 14 may be, for example, a silicon (Si) wafer having a dielectric layer of silicon dioxide ($SiO_2$) formed on its upper surface by oxidation. A first dielectric layer 16', such as silicon dioxide ($SiO_2$), is then formed on the upper surface of the superconducting layer 12'. The thickness of the superconducting layer 12' and first dielectric layer 16' defines one of the dimensions of the junction area. This dimension of the junction area can be accurately controlled and made very small by adjusting the length of time that material is deposited onto the substrate 14 to form these two layers. Each of the layers 12', 16' may vary in thickness from about 0.1 micron to about one or two microns.

Figure 2:
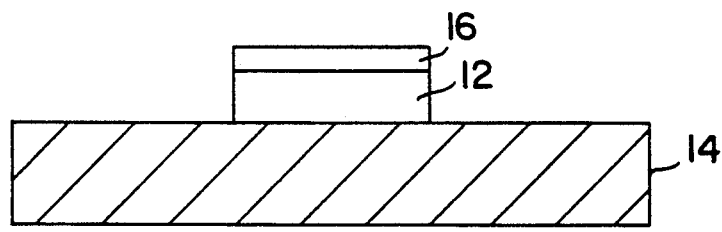
FIG. 2 is a sectional view of the step of etching the superconducting layer and first dielectric layer to form a base electrode contact.
Figure 3:
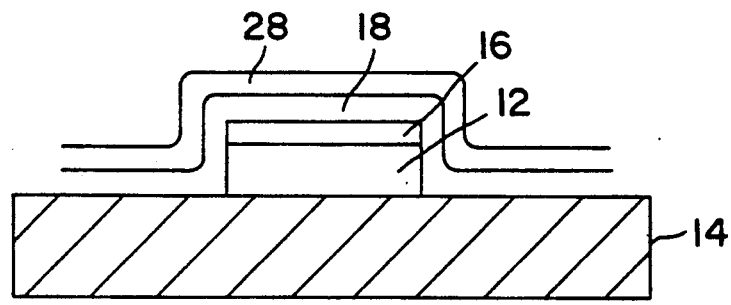
FIG. 3 is a sectional view of the step of forming a laminated junction layer and a second dielectric layer on the insulating substrate.

As shown in FIG. 2, the superconducting layer 12' and first dielectric layer 16' are then patterned and etched down to the substrate 14 using any conventional lithographic technique to form the base electrode contact 12 and first dielectric layer 16. As shown in FIG. 3, the laminated junction layer 18 and a second dielectric layer 28, such as silicon dioxide ($SiO_2$), are formed over the side edges of the base electrode contact 12 and the first dielectric layer 16 and over the upper surfaces of the first dielectric layer 16 and the substrate 14. The second dielectric layer 28 is preferably about 0.2 microns in thickness and the laminated junction layer 18 may vary in thickness from about 0.2 microns to about 2.0 microns.

Figure 4:
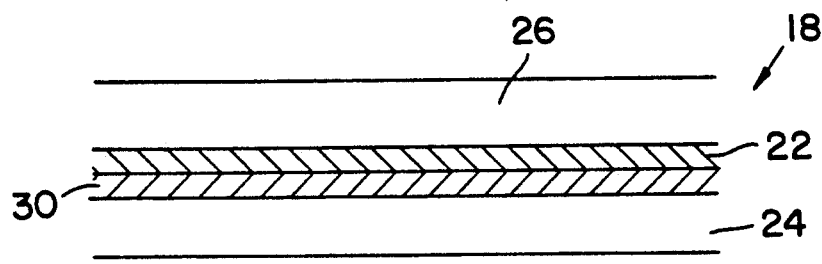
FIG. 4 is an enlarged sectional view of the laminated junction layer.

As shown in FIG. 4, the laminated junction layer 18 includes the superconducting base electrode 24, which may be, for example, niobium (Nb), and a thin metal layer 30, such as aluminum (Al), which is formed on the upper surface of the base electrode 24. The insulating or barrier layer 22, which may be, for example aluminum oxide ($Al_2O_3$), is then formed on the metal layer 30, for example, by oxidizing the surface of the metal layer 30. The superconducting counter electrode 26, which may also be niobium (Nb), is then deposited on the insulating layer 22. To prevent contamination of the junction region, the three layers of the laminated junction layer 18 are formed in situ, with the three layers being formed successively without removing the substrate 14 from the controlled atmosphere of the deposition system.

Figure 5:
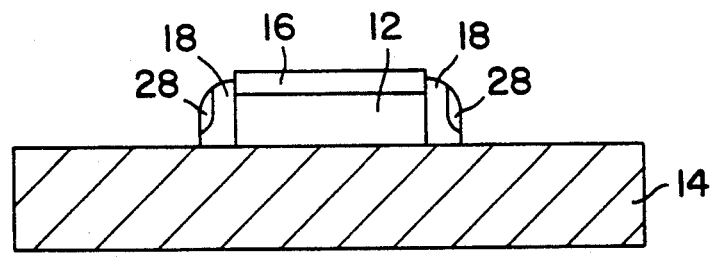
FIG. 5 is a sectional view of the step of anisotropically etching the laminated junction layer and second dielectric layer.
Figure 6:
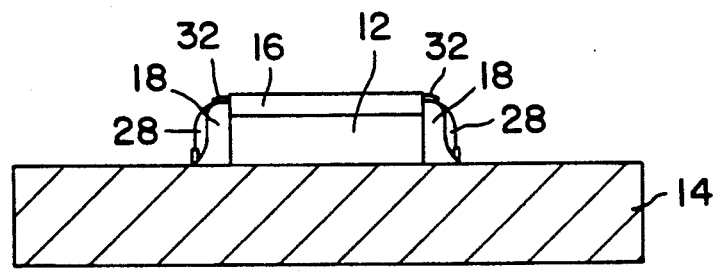
FIG. 6 is a sectional view of the step of sealing the edges of the laminated junction layer.

As shown in FIG. 5, the laminated junction layer 18 and the second dielectric layer 28 are anisotropically etched, such as by reactive ion etching or ion milling, from the upper surfaces of the first dielectric layer 16 and the substrate 14. The vertical portions of the laminated junction layer 18 and the second dielectric layer 28 remain on the side edges of the base electrode contact 12 and first dielectric layer 16. The laminated junction layer 18 and second dielectric layer 28 must be etched below the height of the first dielectric layer 16 so that the laminated junction layer 18 is exposed at its edges. As shown in FIG. 6, the edges of the laminated junction layer 18 are then sealed, such as by thermal oxidation or anodization, to form sealed edges 32. If the base and counter electrodes 24, 26 are niobium (Nb) and the metal layer 30 is aluminum (Al), then the oxidized edges 32 are niobium oxide ($Nb_2O_5$) and aluminum oxide ($Al_2O_3$).

Figure 7:
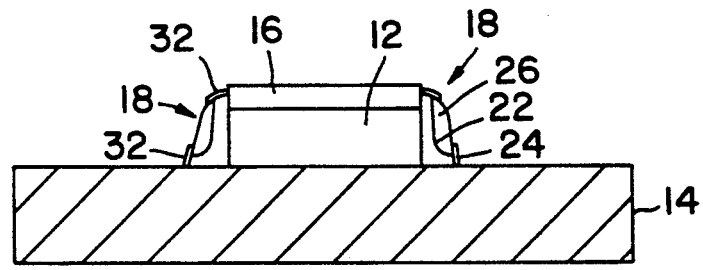
FIG. 7 is a sectional view of the step of removing the second dielectric layer.

As shown in FIG. 7, the second dielectric layer 28 is then selectively removed, such as by wet etching or selective plasma etching, without affecting the laminated junction layer 18 and its sealed edges 32. As shown in FIG. 8, the counter electrode contact 20 is then formed on the upper surface of the laminated junction layer 18. The first dielectric layer 16, the sealed edges 32 of the laminated junction layer 18, and the insulating substrate 14 prevent a short between the base and counter electrode contacts 12, 20.

From the foregoing, it will be appreciated that the present invention represents a significant advance in the field of superconducting Josephson junctions. Although a preferred embodiment of the invention has been shown and described, it will be apparent that other adaptations and modifications can be made without departing from the spirit and scope of the invention. Accordingly, the invention is not to be limited, except as by the following claims.

We claim:

1. A method for fabricating a submicron Josephson junction, comprising the steps of:

forming a superconducting base electrode contact on an insulating substrate;

forming a laminated junction layer in situ on a side edge of the base electrode, the laminated junction layer including an insulating layer interposed between a superconducting base electrode and a superconducting counter electrode; and forming a superconducting counter electrode contact over the laminated junction layer;

wherein one dimension of the junction area is defined by the thickness of the base electrode contact and the other dimension of the junction area is defined by the type of lithography used for fabricating the junction.

2. A method for fabricating a submicron Josephson junction, comprising the steps of:

forming a superconducting layer and a first dielectric layer on the upper surface of an insulating substrate;

patterning and etching the superconducting layer and first dielectric layer down to the substrate to form a base electrode contact and first dielectric layer;

forming a laminated junction layer and a second dielectric layer over the side edges of the base electrode contact and the first dielectric layer and over the upper surfaces of the first dielectric layer and the substrate, the laminated junction layer including an insulating barrier layer interposed between two superconducting layers and being formed in situ;

anisotropically etching the laminated junction layer and second dielectric layer from the upper surfaces of the first dielectric layer and the substrate, with the vertical portions of the laminated junction layer and second dielectric layer remaining on the side edges of the base electrode and the first dielectric layer;

sealing the edges of the laminated junction layer;

removing the second dielectric layer; and forming a superconducting counter electrode contact on the upper surface of the laminated junction layer;

wherein one dimension of the junction area is defined by the thickness of the base electrode contact and first dielectric layer and the other dimension of the junction area is defined by the type of lithography used for fabricating the junction.

3. The method for fabricating the submicron Josephson junction as set forth in claim 2, wherein the superconducting layers are formed by sputtering.

4. The method for fabricating the submicron Josephson junction as set forth in claim 2, wherein the superconducting layers are formed by evaporation.

5. The method for fabricating the submicron Josephson junction as set forth in claim 2, wherein the insulating layer is formed by oxidation.

6. The method for fabricating the submicron Josephson junction as set forth in claim 2, wherein the laminated junction layer and second dielectric layer are anisotropically etched from the upper surfaces of the first dielectric layer and the substrate by reactive ion etching.

7. The method for fabricating the submicron Josephson junction as set forth in claim 4, wherein the laminated junction layer and second dielectric layer are anisotropically etched from the upper surfaces of the first dielectric layer and the substrate by ion milling.

8. The method for fabricating the submicron Josephson junction as set forth in claim 2, wherein the edges of the laminated junction layer are sealed by thermal oxidation.

9. The method for fabricating the submicron Josephson junction as set forth in claim 2, wherein the edges of the laminated junction layer are sealed by anodization.

10. The method for fabricating the submicron Josephson junction as set forth in claim 2, wherein the second dielectric layer is removed by wet etching.

11. The method for fabricating the submicron Josephson junction as set forth in claim 2, wherein the second dielectric layer is removed by selective plasma etching.

12. The method for fabricating the submicron Josephson junction as set forth in claim 2, wherein the superconducting layers are of niobium (Nb) and the insulating layer is of aluminum oxide ($Al_2O_3$).

* * * * *